(12) United States Patent
Kobayakawa et al.

(10) Patent No.: US 6,624,007 B2
(45) Date of Patent: Sep. 23, 2003

(54) METHOD OF MAKING LEADFRAME BY MECHANICAL PROCESSING

(75) Inventors: Masahiko Kobayakawa, Kyoto (JP); Masahide Maeda, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/206,515

(22) Filed: Jul. 25, 2002

(65) Prior Publication Data

US 2003/0020147 A1 Jan. 30, 2003

(30) Foreign Application Priority Data

Aug. 30, 2001 (JP) ........................................ 2001-260637
Jul. 26, 2001 (JP) ........................................ 2001-225673

(51) Int. Cl.[7] .............................................. H01L 21/50
(52) U.S. Cl. ........................ 438/123; 438/110; 438/113; 438/124
(58) Field of Search ................................ 438/123, 110, 438/113, 124, 462; 257/620, 666

(56) References Cited

U.S. PATENT DOCUMENTS

| 6,107,676 A | 8/2000 | Suzuki |
| 6,424,024 B1 * | 7/2002 | Shih et al. ................... 257/667 |
| 6,433,277 B1 * | 8/2002 | Glenn ........................ 174/52.4 |

* cited by examiner

*Primary Examiner*—David L. Talbott
*Assistant Examiner*—Luan Thai
(74) *Attorney, Agent, or Firm*—Merchant & Gould P.C.

(57) ABSTRACT

A semiconductor device is fabricated in the following manner. First, semiconductor chips are mounted on a leadframe prepared from an electroconductive strip of a uniform thickness. Then, wire-bonding is performed on the respective chips, and a resin layer is formed on the leadframe to enclose the chips and the associated bonding wires. Thus, an intermediate product is obtained. Then, the intermediate product is cut into separate, finished devices by using two cutters. One of them is a relatively thin cutter, while the other is a relatively thick cutter. The thin cutter is used for making a full cut in the leadframe, while the thick cutter is used for making a half-depth cut in the leadframe.

8 Claims, 17 Drawing Sheets

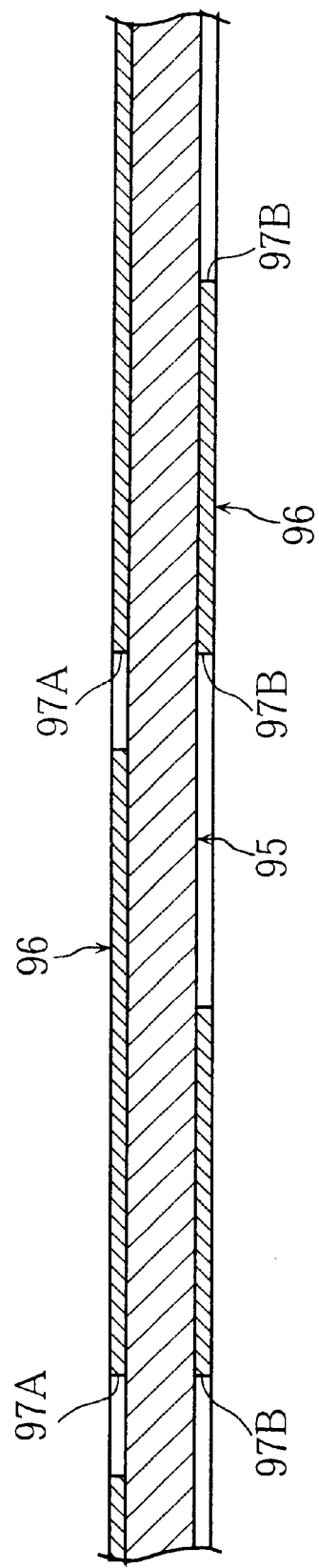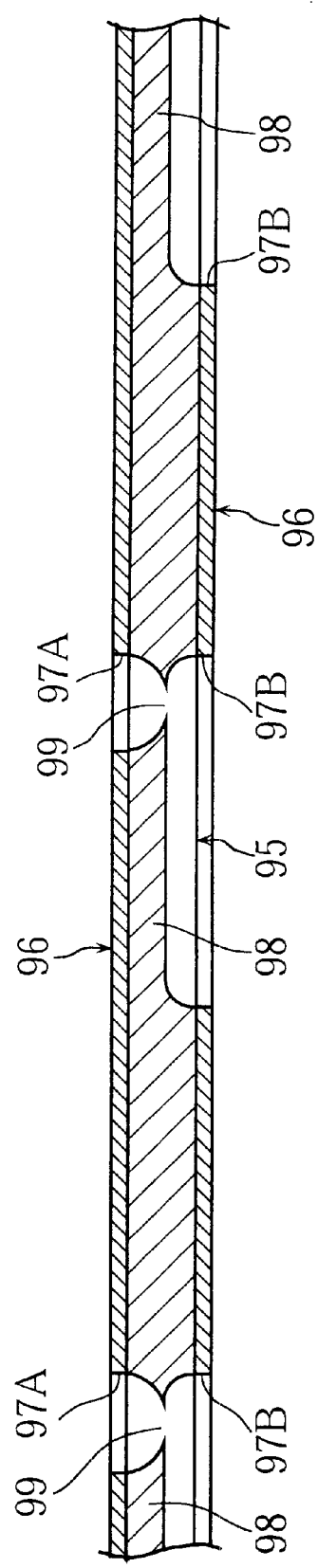
FIG.20A PRIOR ART
FIG.20B PRIOR ART

METHOD OF MAKING LEADFRAME BY MECHANICAL PROCESSING

BACKGROUND OF THE INVENTION

1. Field of the Invention

The present invention relates to a method of making a leadframe used for fabricating a semiconductor device. It also relates to a method of making a semiconductor device by using such a leadframe.

2. Description of the Related Art

FIG. 19A of the accompanying drawings shows a conventional surface-mounting semiconductor device. As illustrated, the device, generally indicated by reference numeral 9, includes a first conductor 90, a second conductor 91 and a semiconductor chip 92. The first conductor 90 has a lower surface (terminal surface) 90a and an upper surface (bonding surface) 90b. Likewise, the second conductor 91 has a lower surface (terminal surface) 91a and an upper surface (bonding surface) 91b. The first conductor 90 generally consists of two portions, i.e., a thinner portion 90c and the remaining thicker portion, which corresponds in position to the terminal surface 90a.

The semiconductor chip 92 is formed with a lower and an upper electrodes (not shown) on its bottom and head surfaces, respectively. The chip 92 is mounted on the first conductor 90, with its lower electrode electrically connected to the bonding surface 90b. The upper electrode of the chip 92 is connected to the bonding surface 91b of the second conductor 91 via a connection wire 93. The chip 92 and the wire 93 are entirely covered by a resin package 94. On the other hand, the terminal surfaces 90a, 91a of the first and the second conductor 90, 91 are exposed in the bottom surface 94a of the package 94.

The semiconductor device 9 is fabricated in the following manner. First, a suitable electroconductive frame (leadframe) is prepared. This frame includes portions to be used as the first and the second conductors 90, 91. The semiconductor chip 92 is mounted on the frame, and then the bonding of the wire 93 is performed. The mounted chip 92 and the wire 93 are enclosed by a resin material. Finally, the thus obtained intermediate product is diced into smaller pieces, one of which provides the semiconductor device 9 shown in FIG. 19A.

As noted above, the first conductor 90 of the device 9 is formed with a thinner portion 90c. This nonuniform thickness results from the corresponding configuration of the leadframe used for making the device 9. Conventionally, such a leadframe is produced from an electroconductive strip by etching. Specifically, referring to FIG. 20A, a mask 96 is formed by e.g. photolithography on the upper and lower surfaces of an electroconductive plate 95 of an uniform thickness. The mask 96 is formed with openings 97A and 97B corresponding in position to the prescribed regions to be etched. Upon application of an etchant, as shown in FIG. 20B, the prescribed portions of the plate 95 are etched away from above and/or below by half the thickness of the plate 95. As a result, some through-holes 99 are formed in the plate 95 at the places where the upper and the lower openings 97A, 97B overlap, whereas some "half-depth dents" are formed at the places where only the lower openings 97B are provided. Due to the provision of the half-depth dents, the plate 95 is formed with thin-walled portions 98 whose thickness is generally half the original thickness of the plate 95.

The conventional leadframe fabrication method has the following drawbacks.

The first problem is that the above etching process is rather difficult to perform on a hoop material. Thus, before a mask-forming process and etching process are carried out, the hoop needs to be cut into shorter pieces so that proper etching result can be obtained. Apparently, this additional cutting procedure diminishes the production efficiency.

The second problem is that the mask-forming process is time-consuming. Also, after the etching process is over, the mask 96 formed on the plate 95 needs to be removed. This results in a decrease in efficiency and an increase in cost.

The third problem is that the required configuration of the parts of the leadframe often fails to be obtained by etching. Referring to FIG. 19B, which is a plan view showing the first conductor 90 and the semiconductor chip 92 mounted on the conductor 90, the first conductor 90 is provided with round corners resulting from inevitable spreading of the etchant, even when use is made of an etching mask formed with a completely rectangular opening in it. Unfavorably, the round-cornered first conductor 90 has a smaller effective bonding area for the chip 90 than otherwise. This means that the marginal portion 90d of the conductor 90 is not used for any productive purposes but merely cause an increase in overall size of the semiconductor device 9.

SUMMARY OF THE INVENTION

The present invention has been proposed under the circumstances described above. It is, therefore, an object of the present invention to provide a fabrication technique, whereby a compact semiconductor device can be produced efficiently and at low cost.

According to a first aspect of the present invention, there is provided a method of making a semiconductor device. The method comprises the steps of: mounting a semiconductor chip on a leadframe; producing an intermediate product by forming a packaging layer to enclose the chip, wherein the intermediate product includes the leadframe, the chip and the packaging layer; and cutting the intermediate product. The cutting step is performed by using a first cutter of a first thickness and a second cutter of a second thickness greater than the first thickness. The first cutter is used for making a "full cut" in the leadframe, while the second cutter is used for making a "partial cut" in the leadframe. In this specification, the "full cut" implies that the leadframe is cut through in its thickness direction. The "partial cut", on the other hand, implies that the leadframe is not cut through in its thickness direction (nor in any other directions) and the depth of the cut is smaller than the thickness of the leadframe. The determination of where the full cut and the partial cut are to be made is based on a common cut line, so that the full cut and the partial cut coact to prevent the formation of burrs at the cut site.

The partial cut may be made after or before the full cut is made.

Preferably, the method of the present invention may further comprise the step of preparing the leadframe by processing an electroconductive material of a uniform thickness. In this case, the leadframe-preparing step may include sub-steps such as first punching, stamping and second punching. The first punching may be performed for forming a patterned region in the electroconductive material, the stamping may be performed for compressing the patterned region to provide a stamped portion of a thickness smaller than the uniform thickness of the electroconductive material, and the second punching may be performed for removing an unnecessary part from the stamped portion.

Preferably, the first punching may produce a "land" and an opening adjacent to the land. In this arrangement, when the subsequent stamping compresses the land, this land is allowed to spread out into the opening. This is advantageous to preventing unfavorable stress due to the stamping from remaining in the leadframe.

Preferably, the packaging layer may be formed in a manner such that it covers the stamped portion entirely but allows part of the leadframe to be exposed.

According to a second aspect of the present invention, there is provided a method of making a leadframe for fabricating a semiconductor device. The method may comprise the steps of: performing first punching on an electroconductive material of a uniform thickness; stamping the electoroconductive material to form a stamped portion of a thickness smaller than the uniform thickness of the electoroconductive material; and performing second punching on the electroconductive material to remove an unnecessary part from the stamped portion.

Other features and advantages of the present invention will become apparent from the detailed description given below with reference to the accompanying drawings.

BRIEF DESCRIPTION OF THE DRAWINGS

FIGS. 20A and 20B show intermediate steps of a method of making a leadframe used for fabricating the conventional semiconductor device shown in FIG. 19A.

DETAILED DESCRIPTION OF THE PREFERRED EMBODIMENTS

Preferred embodiments of the present invention will be described below with reference to the accompanying drawings.

Figure 1:
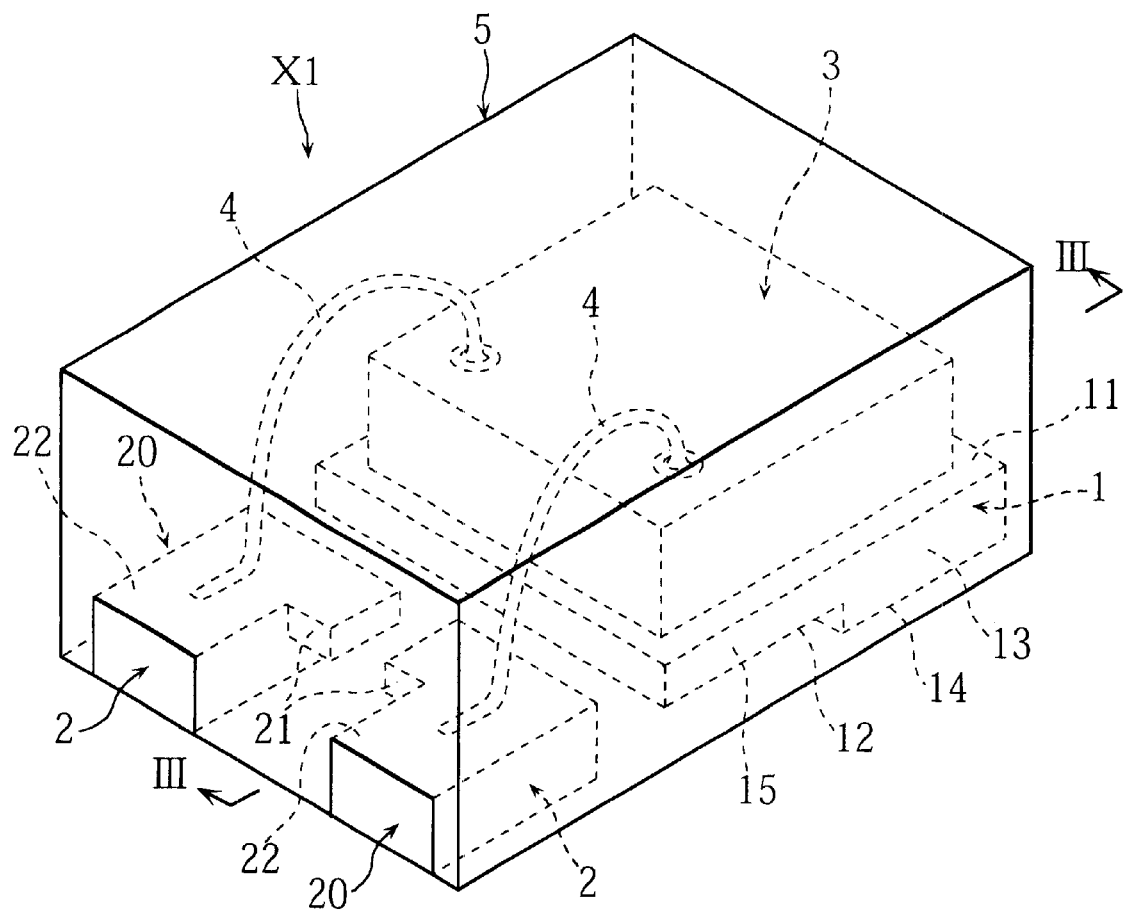
FIG. 1 shows the inside arrangement of a semiconductor device fabricated by a method of the present invention.
Figure 2:
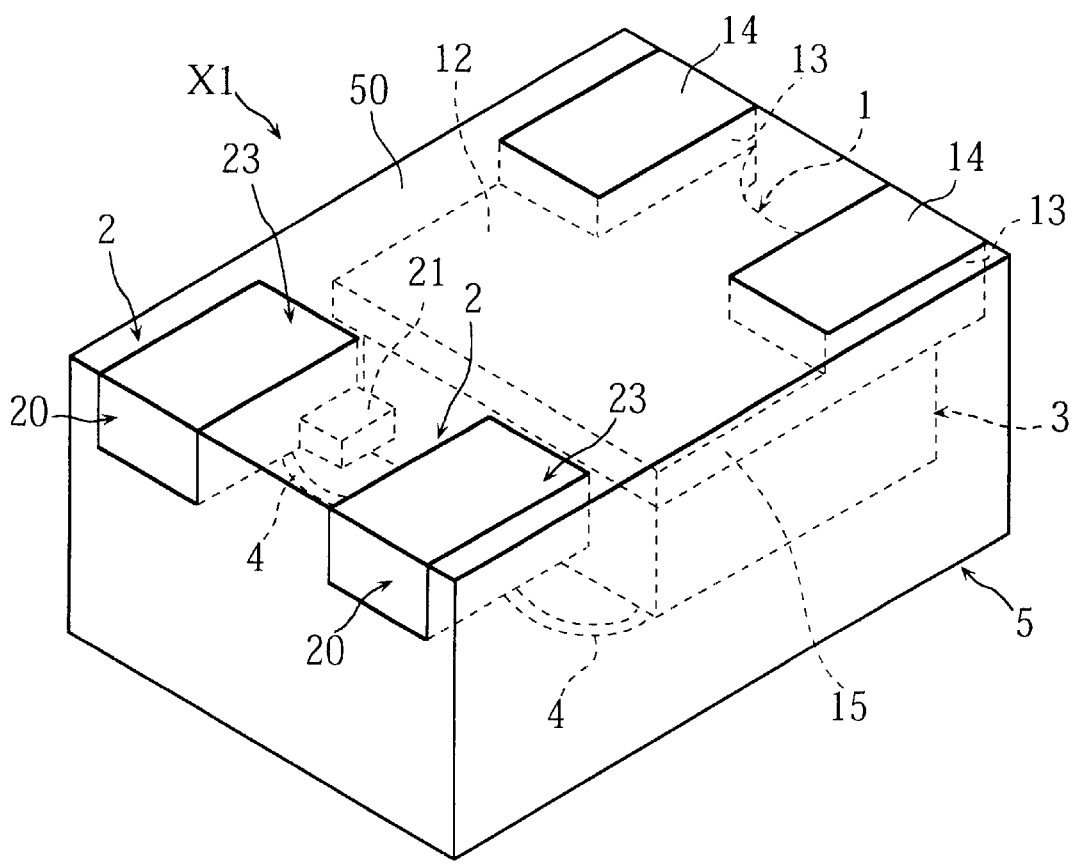
FIG. 2 shows the bottom side of the semiconductor device of FIG. 1.
Figure 3:
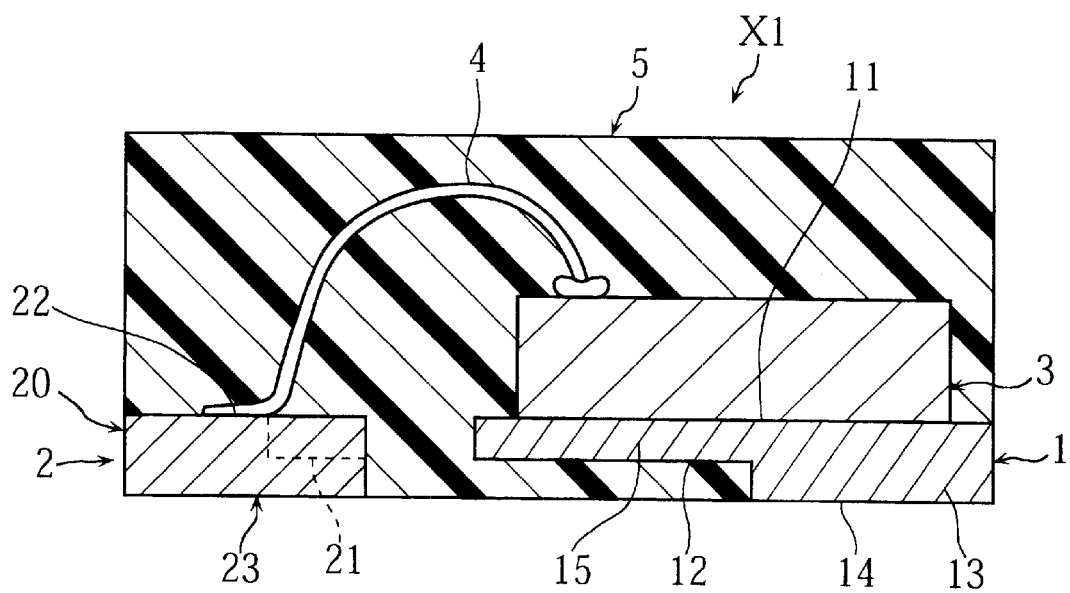
FIG. 3 is a sectional view taken along lines III—III in FIG. 1.

Reference is first made to FIGS. 1~3 illustrating a semiconductor device embodying the present invention. The device, generally indicated by sign X1, includes a first conductor 1, a second conductor 2, a semiconductor chip 3, connection wires 4 and a resin package 5.

The first conductor 1, which appears to be rectangular in plan view, includes a flat, upper surface 11 to mount the semiconductor chip 3 and a lower surface 12 which is not a flat as a whole. The lower surface 12 is formed with two protrusions 13 each having a flat surface 14. As best shown in FIG. 2, the flat surfaces 14 of the respective protrusions 13 are exposed in the bottom surface 50 of the resin package 5, to serve as a terminal for electrical connection. The first conductor 1 is divided into two kinds of portions depending upon its thickness, namely, a thicker portion corresponding in position to the protrusions 13 and a thinner portion 15 which is the remaining portion of the conductor 1 other than the thicker portion.

The second conductors 2 each include a body 20 and a relatively small portion 21 projecting from the body 20. As shown in FIGS. 1 and 3, each second conductor 2 has a flat upper surface 22 serving as a bonding surface for the wire 4 connecting the second conductor 2 to the chip 3. Each second conductor 2 also has a lower surface 23 which is exposed in the bottom surface 50 of the package 5 to be used as a terminal for electrical connection.

Though not shown in the figures, the semiconductor chip 3 is provided with an upper and a lower electrodes on its upper and lower surfaces, respectively. The chip 3 is surface-mounted onto the upper surface 11 of the first conductor 11 via an electroconductive material such as solder paste or silver paste. With this electroconductive material, the non-illustrated lower electrode of the chip 3 is electrically connected to the first conductor 1. The other non-illustrated electrode (upper electrode) of the chip 3 is electrically connected to the upper surfaces 22 of the respective second conductors 2 via the wires 4.

The resin package 5 encloses the chip 3 and the wires 4. In the bottom surface 50 of the resin package 5, as noted above, the terminal surfaces 14 and 24 are exposed. Thus, the semiconductor device X1 can be surface-mounted onto a printed circuit board for example. The package 5 encloses the thinner portions 15 and 21 of the first and the second conductors 1 and 2. Thus, the first and the second conductors 1, 2 are stably fixed in the package 5.

The semiconductor device X1 may be produced through several steps including a leadframe fabrication step, a die-bonding step, a wire-bonding step, a leadframe-cutting step, a resin-packaging step and a dicing step. In the following description, the first four steps (i.e., the leadframe fabrication step, the die-bonding step, the wire-bonding step and the leadframe-cutting step) are supposed to be performed in the same production line ("hoop line").

Figure 4:
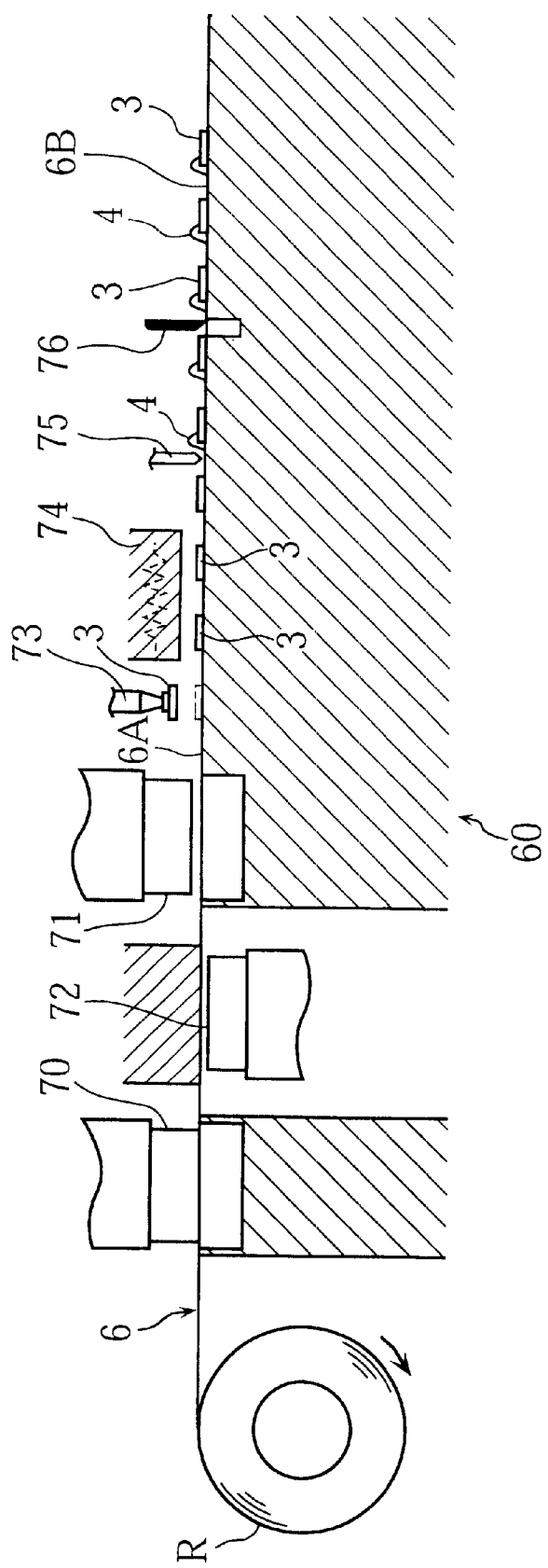
FIG. 4 shows a production line, or hoop line, for implementing the fabrication method of the present invention.

Referring to FIG. 4, for the hoop line, use is made of a roll R of electroconductive flat material (referred to as "strip" below) 6. As unwound from the roll R, the strip 6 is forwarded on a working table 60 intermittently at certain intervals. In the leadframe fabrication step, the strip 6 is consecutively subjected to sub-steps such as first punching, stamping and second punching. Each of these sub-steps is performed when the transfer of the strip 6 is temporarily being stopped. Specifically, for the first punching, a punch 70 is caused to push against the strip 6 from above. Then, for the stamping subsequent to the first punching, a suitably configured die 72 is caused to push against the strip 6 from below. Finally, for the second punching, another punch 71 is caused to push against the strip 6 from above again.

Figure 5:
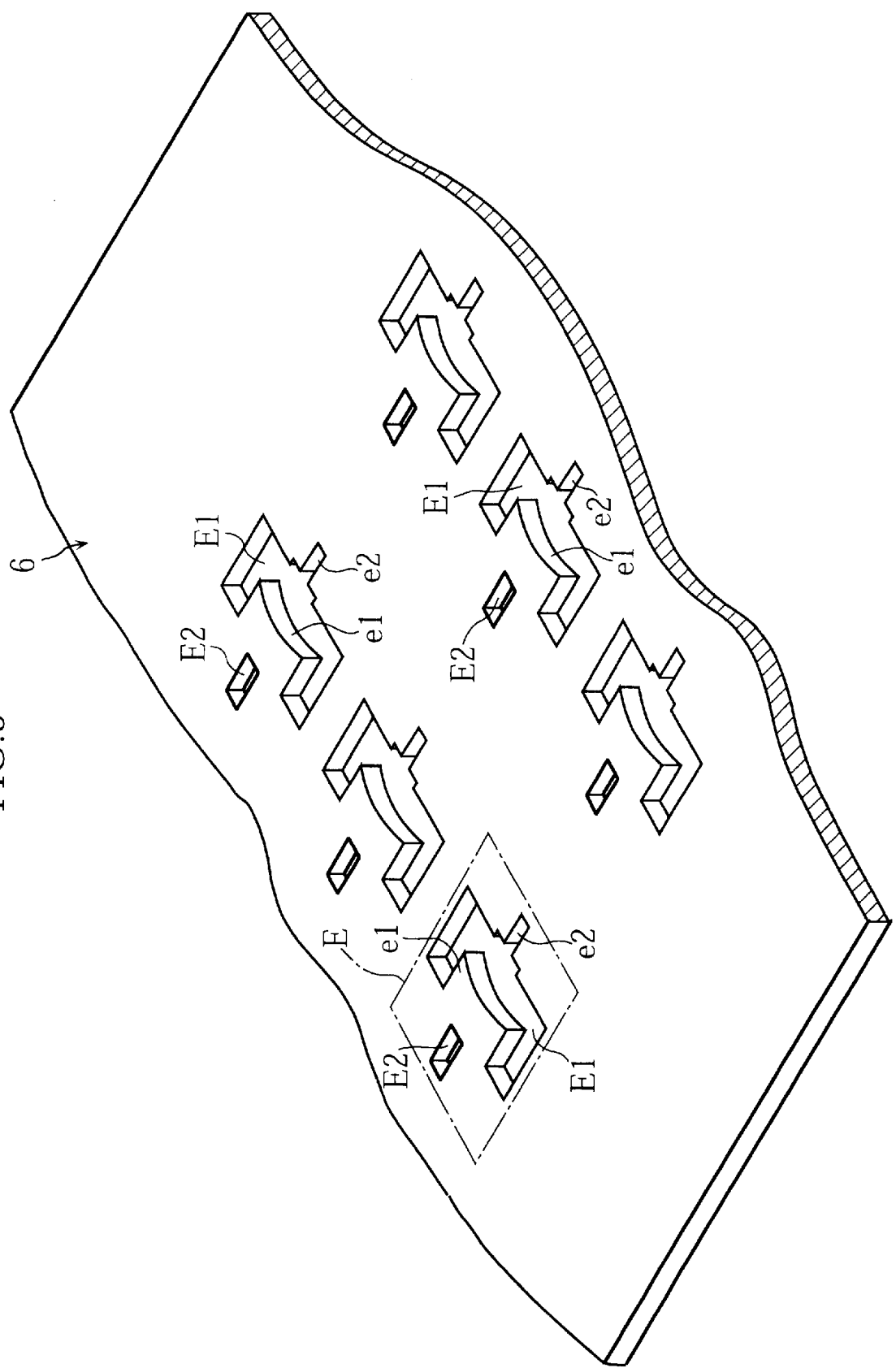
FIG. 5 shows an electroconductive strip subjected to a first punching process of the present invention.

By the first punching, the strip 6 is formed with a plurality of regions E, as seen from FIG. 5 (bottom side view). Each of the regions E is formed with a larger opening E1 and a smaller opening E2. Other than the openings E1 and E2, the region E includes a "land" as the remaining part of the region E. In the illustrated example, the land includes a generally rectangular naze e1 that juts out into the larger opening E1. Across the naze e1, a cutout e2 is provided.

Figure 6:
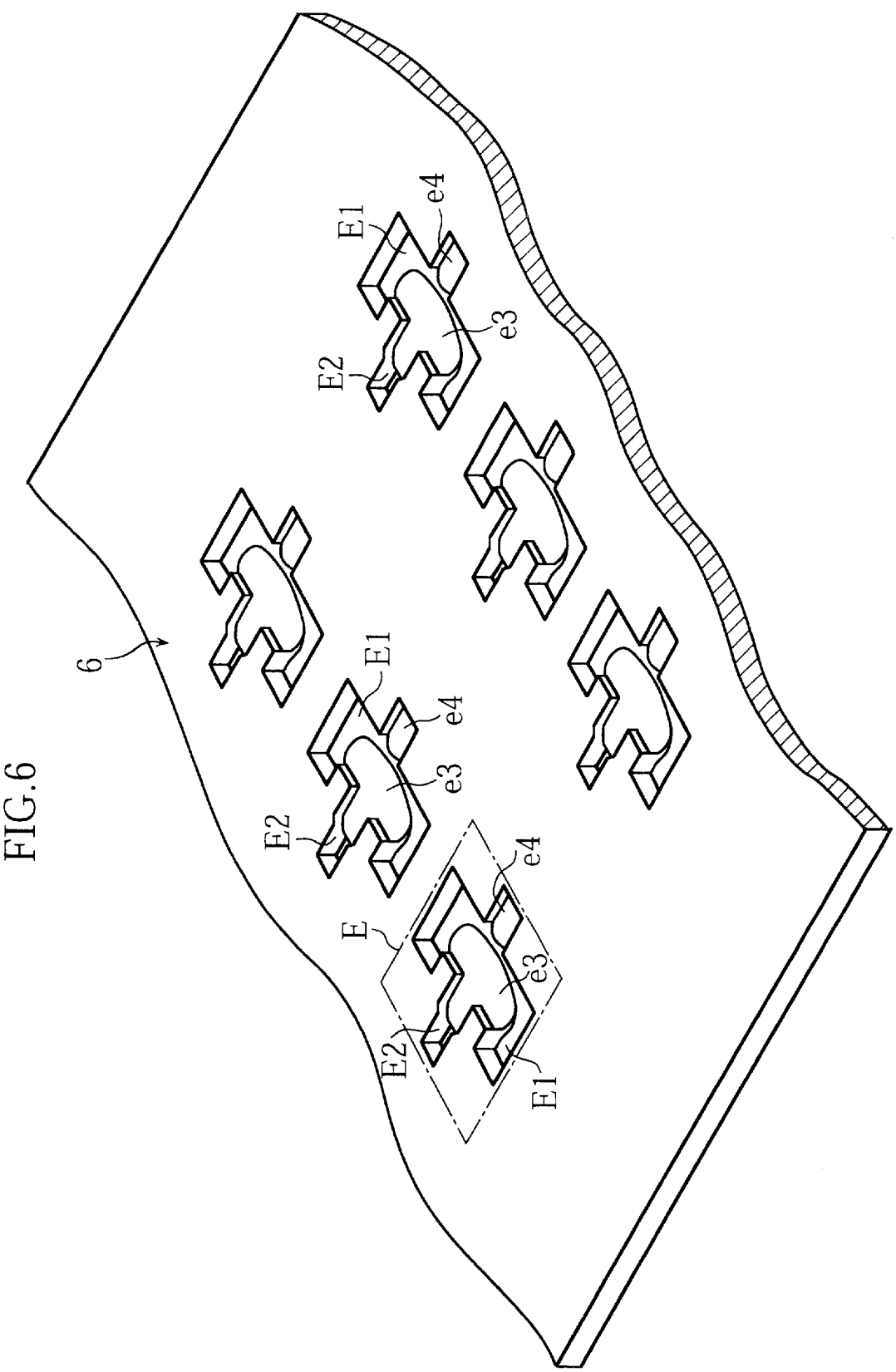
FIG. 6 shows the electroconductive strip subjected to a stamping process that follows the first punching process.

When each region E is subjected to stamping, the naze e1 and some predetermined areas that flank the smaller opening E2 and the cutout e2 are compressed to half the initial thickness of the strip 6. Thus, as shown in FIG. 6, stamped portions e3 and e4 will result.

Generally, a metal plate often suffers from residual stress after being subjected to stamping. Such residual stress is unfavorable since it may warp the plate. In the strip 6 of the present invention, however, no great stress will remain even when the strip 6 is subjected to the above-described stamping operation. This is because the openings E1, E2 (including the cutout e2), which are formed prior to the stamping operation, serve as stress-absorbing room into which the stamped portions can be spread out. In this manner, the building-up of residual stress is advantageously prevented.

Figure 7:
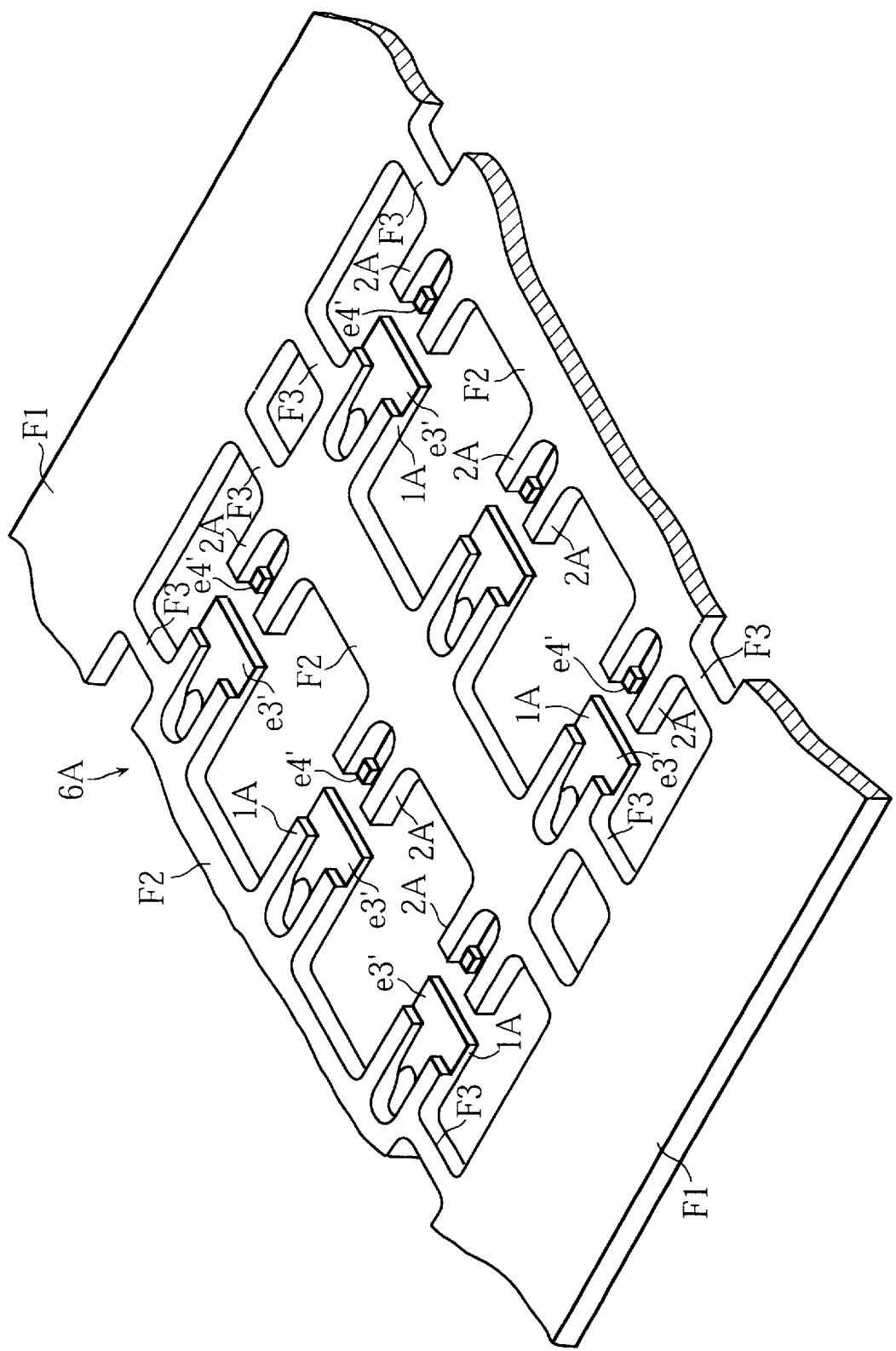
FIG. 7 shows the electroconductive strip subjected to a second punching process that follows the stamping process.

The second punching subsequent to the stamping described above produces the patterned frame 6A as shown in FIG. 7 (bottom side view). The frame 6A is obtained by removing unnecessary portions from the strip 6 of FIG. 6. The stamped portions e3 and e4 (FIG. 6) are processed into thin-walled portions e3', e4' (FIG. 7). Though the stamped portions e3 and e4 have rather round edges and are nonuniform in thickness, the thin-walled portions e3' and e4' have straight edges and flat surfaces and are uniform in thickness.

Differing from the conventional etching method, which is chemical processing, the punching/stamping method of the present invention is advantageous in several respects. For example, there is no need to form a mask on the workpiece to be processed into the desired pattern. Thus, the production efficiency is remarkably improved. Further, it is easier by the above punching/stamping method to configure the workpiece into a straight and flat shape, as discussed with reference to FIG. 7. Thus, in comparison to the conventional chemical method, the mechanical processing of the present invention can provide the resultant first conductor 1 (see FIG. 3 for example) with a larger chip-mounting area.

Referring back to FIG. 4, in the die-bonding step of the present invention, a suction collet 73 is used for mounting a semiconductor chip 3 onto the leadframe 6A. The mount area is the upper side of a first portion 1A of the frame 6A (see FIG. 7, which shows the bottom side of the frame).

Though not illustrated, an electroconductive material such as solder paste is applied to the lower electorodes of the chip 3 prior to the mounting operation. The chip 3 mounted on the frame 6A is carried into a furnace 74 for melting the solder paste (reflow soldering). Then, the chip 3 is taken out from the furnace 74 to allow the melted solder material to solidify.

After the die-bonding step, the wire-bonding operation is performed by using a conventional wire bonder. Specifically, the wire bonder includes a capillary 75 from which wire 4 is paid out. For the first bonding, the tip of the paid-out wire 4 is melted and then pressed against the upper electrode of the chip 3. After the wire 4 is fixed to the upper electrode, the capillary 75 is shifted in position, as the wire 4 is being additionally paid out, to perform the second bonding with respect to a relevant second portion 2A (see FIGS. 7 and 8). Then, the capillary 75 is pressed against the second portion 2A to fix the wire 4.

Accordingly to the present invention, no great residual stress is produced in the leadframe 6A as a result of the stamping. Accordingly, the die-bonding area and the wire-bonding area of the first or second portion 1A, 2A are kept flat enough to perform proper die-bonding or wire-bonding operation.

Figure 8:
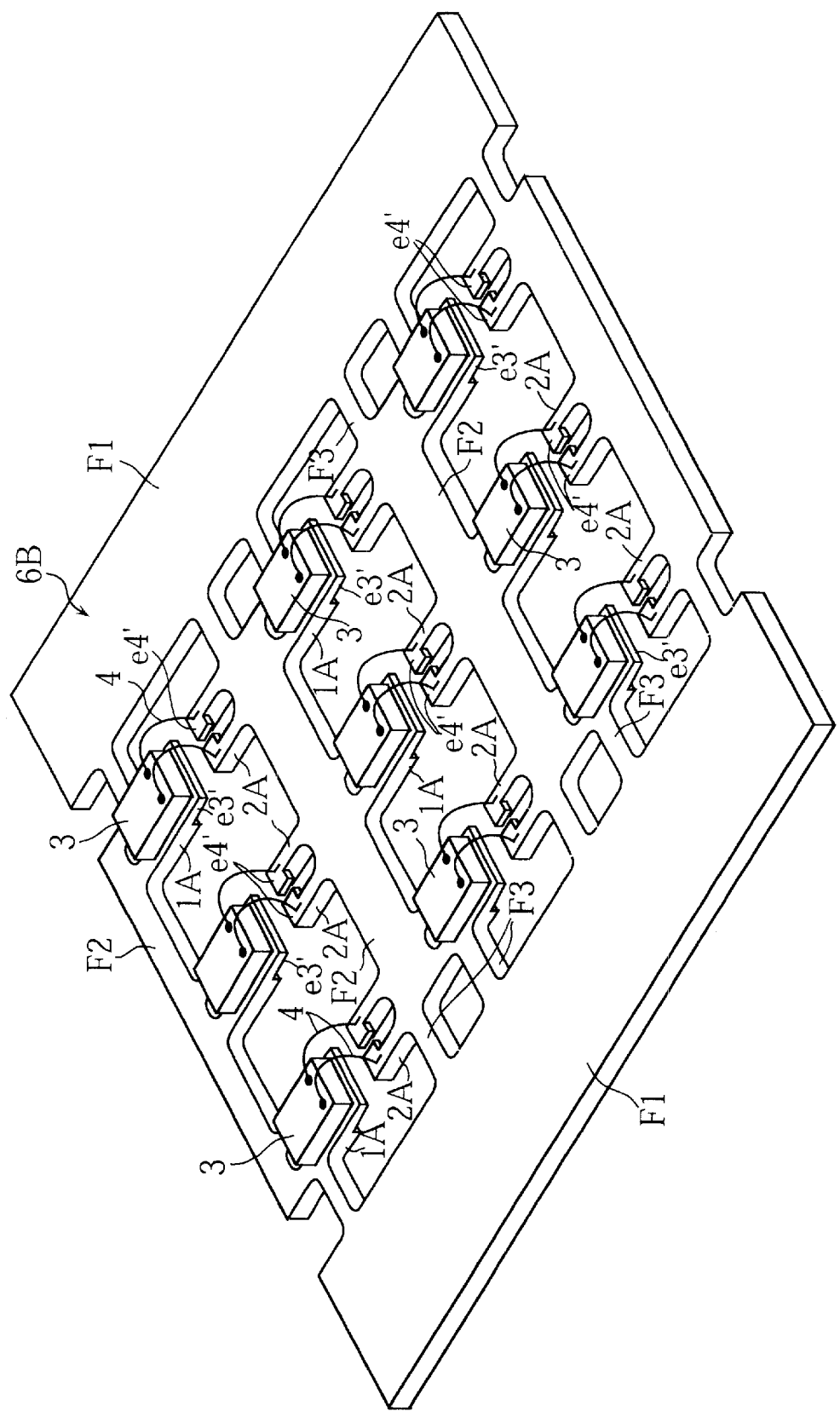
FIG. 8 shows a section of leadframe on which a predetermined number of semiconductor chips are mounted.

In the leadframe-cutting step, use is made of a cutting tool 76 to cut the long, continuous leadframe 6A into shorter elements 6B shown in FIG. 8.

In the resin-packaging step subsequent to the leadframe-cutting step, the divided frame element 6B of FIG. 8 is clamped between an upper and a lower molding dies coacting to provide a single molding cavity or a plurality of cavities that correspond in number and position to the respective semiconductor chips 3 (and their associated elements such as wires 4 and the portions 1A~2A) shown in FIG. 8. When only a single molding cavity is provided, all the chips 3 and their associated elements of FIG. 8 are accommodated together in the single molding cavity. When the cavities as many as the chips 3 of FIG. 8 are provided, each of the chips 3 is accommodated in the relevant one of the molding cavities. Then, a thermosetting resin for example is poured into the cavity or cavities. After the resin material is hardened, the upper and the lower molding dies are separated to release the molded intermediate product.

Finally, to dice the molded intermediate product into individual semiconductor device X1 shown in FIGS. 1~3, use may be made of a conventional cutting tool such as a diamond cutter.

In accordance with the above-described method, the leadframe 6A shown in FIG. 7 is produced by mechanical processing including punching and stamping. Advantageously, such a leadframe can be made in a single production line where die-bonding and wire-bonding are performed. Thus, as opposed to the conventional method entailing an etching process, which is incompatible with a hoop line, the method of the present invention is much more efficient and cost-effective.

The method of the present invention is applicable to fabricating semiconductor device X2~X15 shown in FIGS. 9~12, 13A~13E and 14A~14E. Like the above-described device X1, the devices X2~X15 have a thin-walled portion in their terminal conductors.

Figure 9:
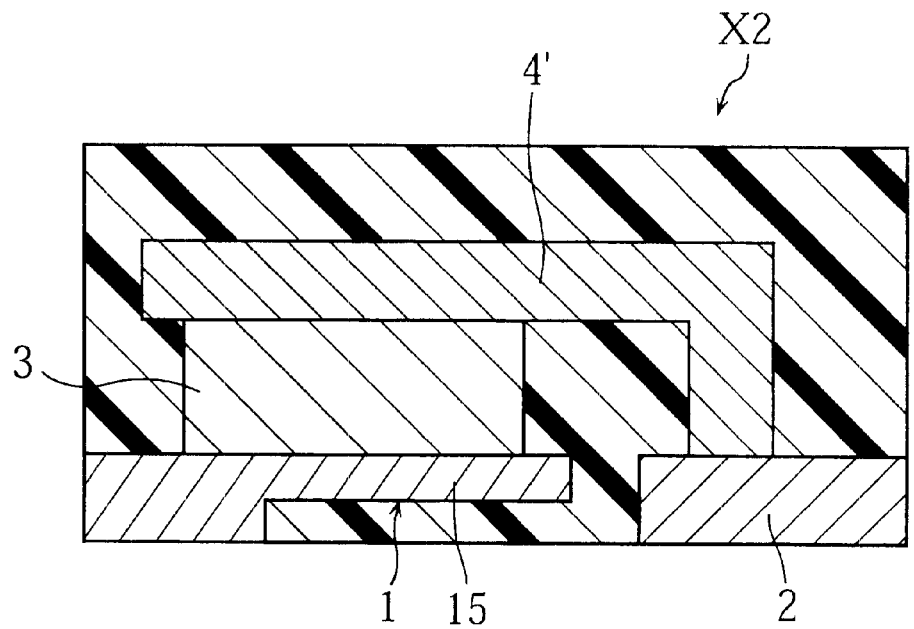
FIG. 9 is a sectional view showing the inside structure of a second example of semiconductor device to which the present invention is applicable.

Specifically, the semiconductor device X2 of FIG. 9 includes a first and a second conductors 1 and 2. The first conductor 1 supports a semiconductor chip 3 and has a relatively thin portion 15. The second conductor 2 is electrically connected to the upper electrode (not shown) of the chip 3 via a bent, electroconductive strip 4'.

Figure 10:
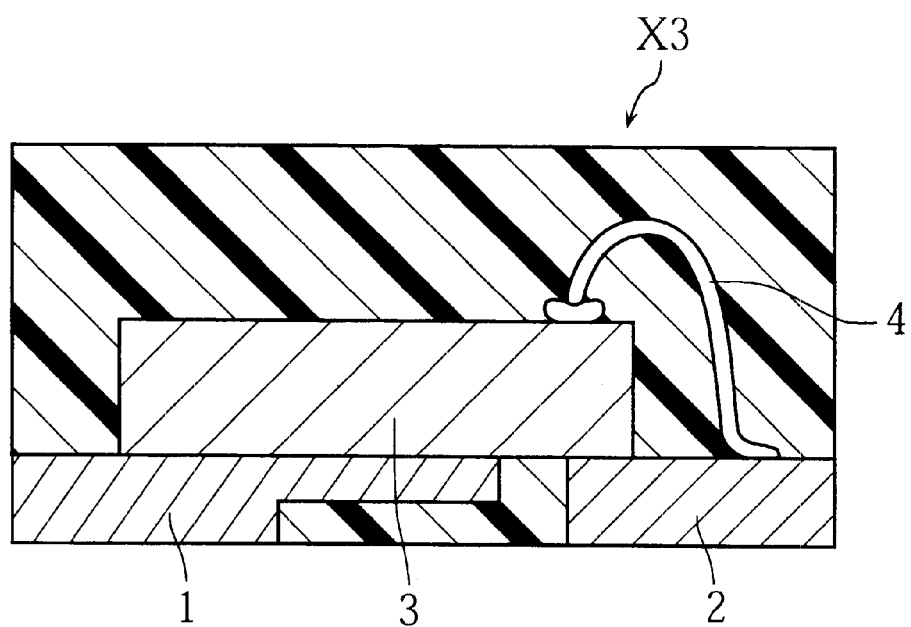
FIG. 10 is a sectional view showing the inside structure of a third example of semiconductor device to which the present invention is applicable.

Referring to FIG. 10, the semiconductor device X3 includes a semiconductor chip 3 arranged to bridge between a first and a second conductors 1, 2. A wire 4 electrically connects the non-illustrated upper electrode of the chip 3 to the second conductor 2.

Figure 11:
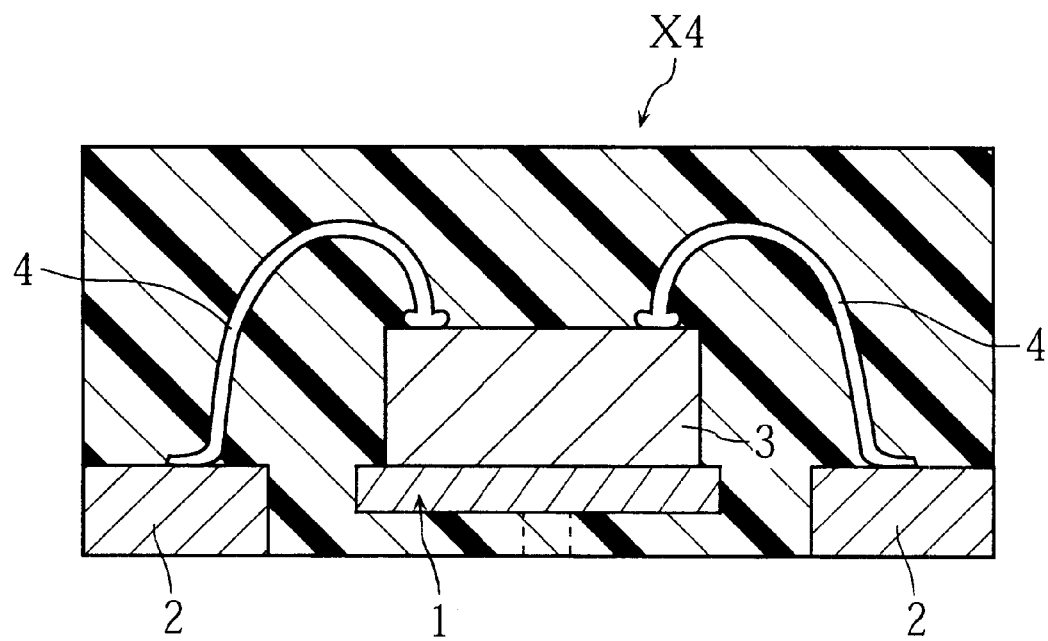
FIG. 11 is a sectional view showing the inside structure of a fourth example of semiconductor device to which the present invention is applicable.

Referring to FIG. 11, the semiconductor device X4 includes a first conductor 1 on which a semiconductor chip 3 is mounted. The device X4 also includes two second conductors 2 flanking the first conductor 1. Each second conductor 2 is connected to the chip 3 via a wire 4. The first conductor 1 as a whole is thinner than the second conductors 2. To establish electrical connection to an external element for example, the first conductor 1 may have a projection (depicted in chain lines) an end of which is exposed in a prescribed surface of the resin package.

Figure 12:
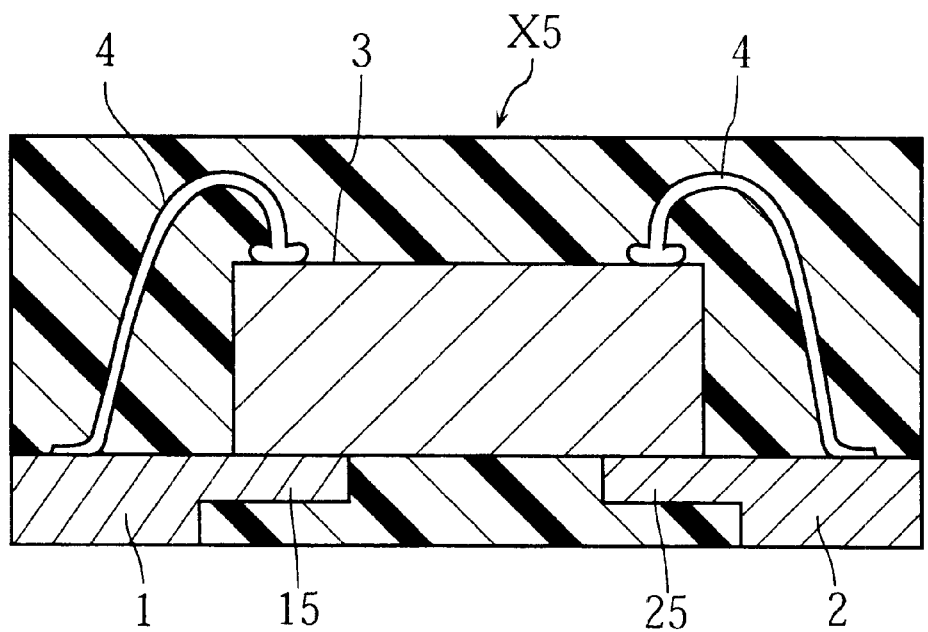
FIG. 12 is a sectional view showing the inside structure of a fifth example of semiconductor device to which the present invention is applicable.
Figure 13A:
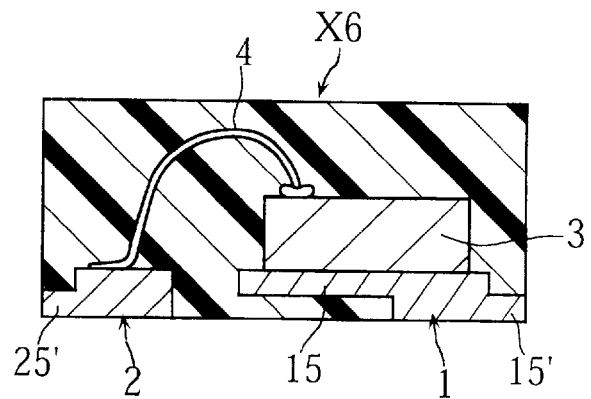
FIGS. 13A~13E are sectional views showing the inside structure of sixth to tenth examples of semiconductor device to which the present invention is applicable.
Figure 13B:
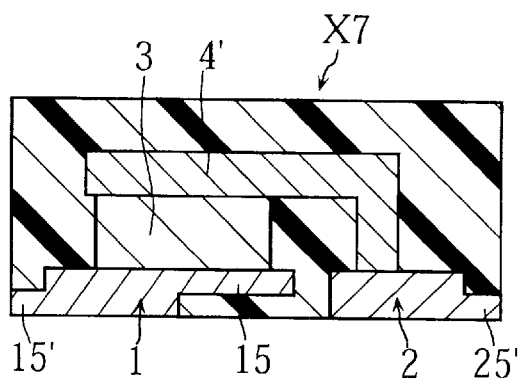
Figure 13D:
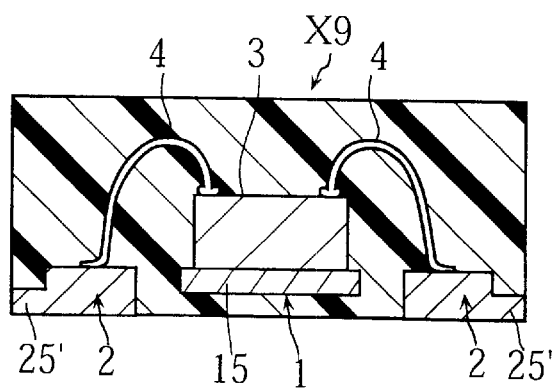
Figure 13C:
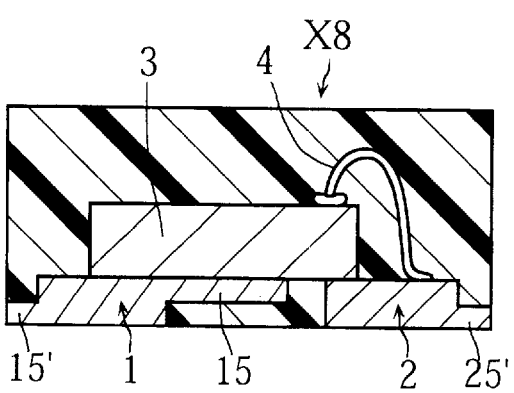
Figure 13E:
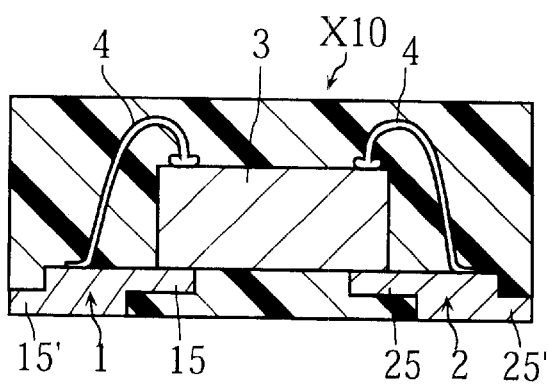
Figure 14A:
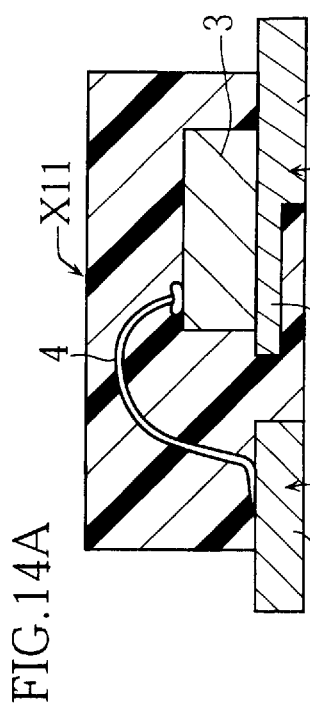
FIGS. 14A~14E are sectional views showing the inside structure of eleventh to fifteenth examples of semiconductor device to which the present invention is applicable.
Figure 14D:
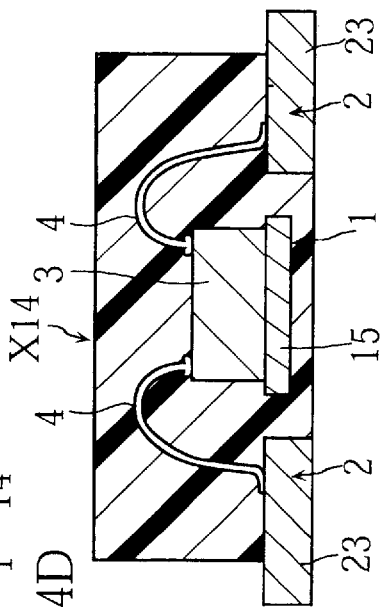
Figure 14E:
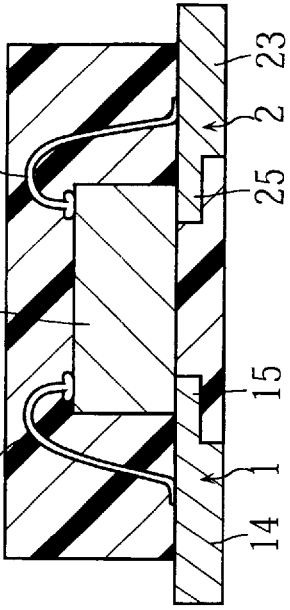
Figure 14B:
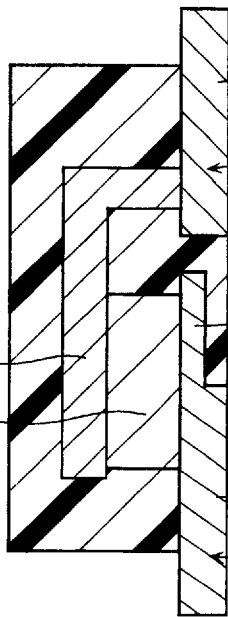
Figure 14C:
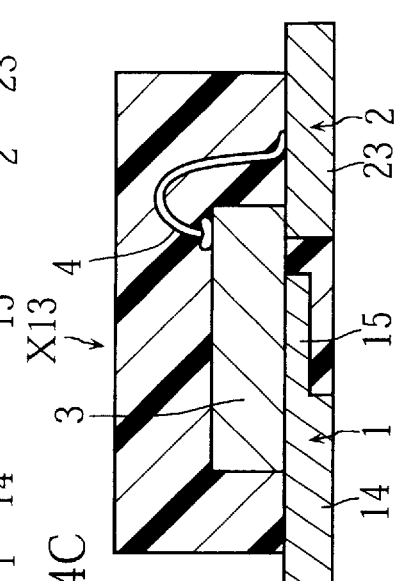

Referring to FIG. 12, the semiconductor device X5 includes a first and a second conductors 1, 2 formed with thinner portions 15 and 25, respectively. A semiconductor chip 3 is arranged to bridge between the two thinner portions 15 and 25. The chip 3 may be provided with two upper electrodes, one of which is connected to the first conductor 1 via a wire 4, and the other one of which is connected to the second conductor 2 via another wire 4. The wires 4 may be omitted when the non-illustrated electrodes of the chip 3 are brought into direct contact with the terminal conductors 1, 2 by face down bonding.

Referring to FIGS. 13A~13E, the semiconductor devices X6~X10 are similar to the above-described devices X1~X5, respectively. The difference is that additional thin-walled portions 15' or 25' are formed in the terminal conductors 1 or 2 of the devices X6~X10. Apparently, the present invention is applicable to providing such a nonuniform-thickness configuration.

According to the present invention, the first or the second conductor 1, 2 may protrude sideways from the resin package, as in the semiconductor devices X11~X15 shown in FIGS. 14A~14E, respectively.

Figure 15:
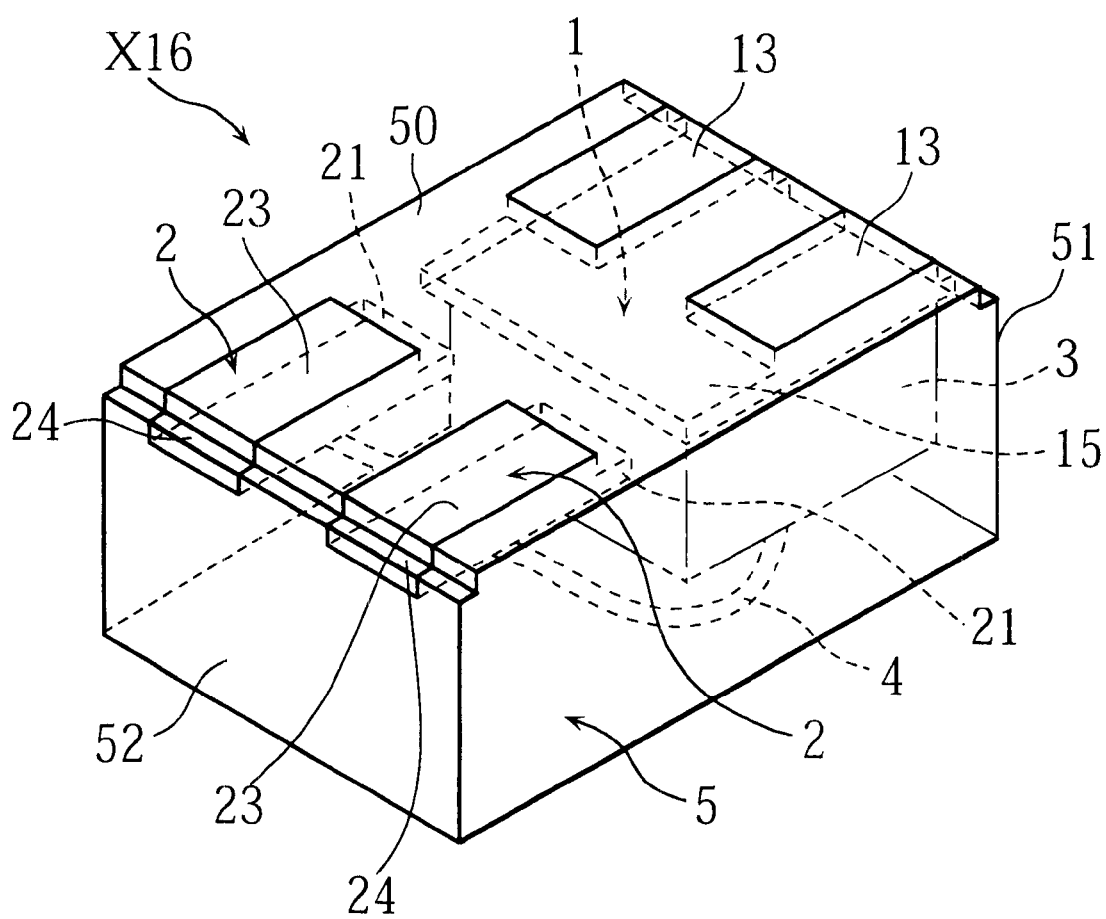
FIG. 15 shows the bottom side of a sixteenth example of semiconductor device to which the present invention is applicable.

Reference is now made to FIG. 15 showing a perspective bottom view of a semiconductor device X16 embodying the present invention.

Like the first semiconductor device X1 (see FIG. 2 for example), the semiconductor device X16 includes a first conductor 1, two second conductors 2, a semiconductor chip 3 (mounted on the first conductor 1), wires 4 (connecting the chip 3 to the second conductors 2), and a resin package 5 (enclosing the chip 3 and the wires 4).

The first conductor 1 is divided into a relatively thin portion 15 and a relatively thick portion where two protrusions 13 are provided. As illustrated, the protrusions 13 are exposed in the bottom surface 50 of the resin package 5 for electrical connection to a printed circuit board for example. The relatively thin portion 15 includes an outer projection 15a (see FIG. 17B for example) exposed in a first side surface 51 of the package 5.

Each of the second conductors 2 includes a relatively thick portion having a lower surface 23 exposed in the bottom surface 50 of the package 5. Also, each second conductor 2 includes an inner lateral projection 21 and an outer lateral projection 24 opposite to the inner projection 21. The inner projection 21 is entirely covered by the resin package 5, while the outer projection 24 is exposed in a second side surface 52 of the package 5 that is opposite to the first side surface 51.

Figure 16:
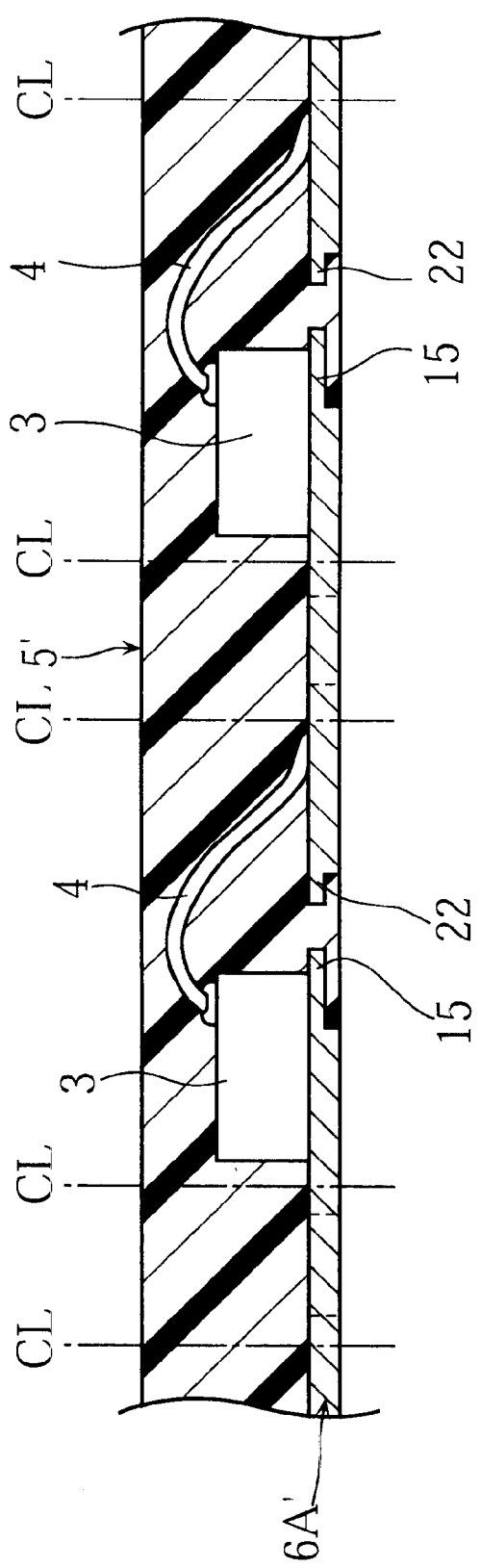
FIG. 16 is a sectional view showing the intermediate product produced by a fabrication method for the device of FIG. 15.

The semiconductor device X16 can be fabricated in generally the same manner as the device X1. Specifically, as described above with reference to FIG. 4, a continuous electroconductive material is subjected to a leadframe-preparing procedure which includes punching and stamping operations. Then, semiconductor chips 3 are mounted on the leadframe and fixed thereto by reflow soldering. Then, wire-bonding and package-forming operations are performed. The thus obtained intermediate product generally gives a sectional view as shown in FIG. 16. In this figure, reference numeral 5' refers to the resin layer formed in the package-forming operation, and the sign CL refers to cutting lines along which the intermediate product is cut into individual semiconductor devices.

The cutting operation may use two rotary cutters: one having a blade of relatively small width and the other having a blade of relatively great width.

Figure 17A:
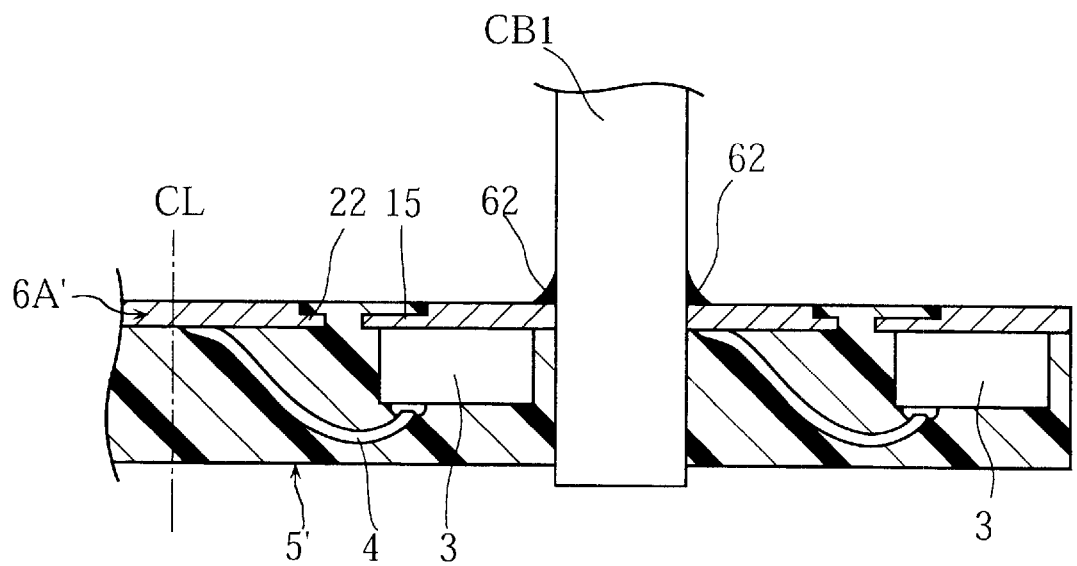
FIGS. 17A and 17B are sectional views showing how required cuts are made in the intermediate product shown in FIG. 16.

Specifically, as shown in FIG. 17A, the first cut is performed with the use of a thinner cutter CB1. As illustrated, the cutter CB1 cuts through the entire thickness of the intermediate product ("full cut" step). As a result of this first cutting operation, some burrs 62 may be formed along the cut. Such burrs will be unfavorable e.g. for achieving proper surface-mounting of the finished product.

Figure 17B:
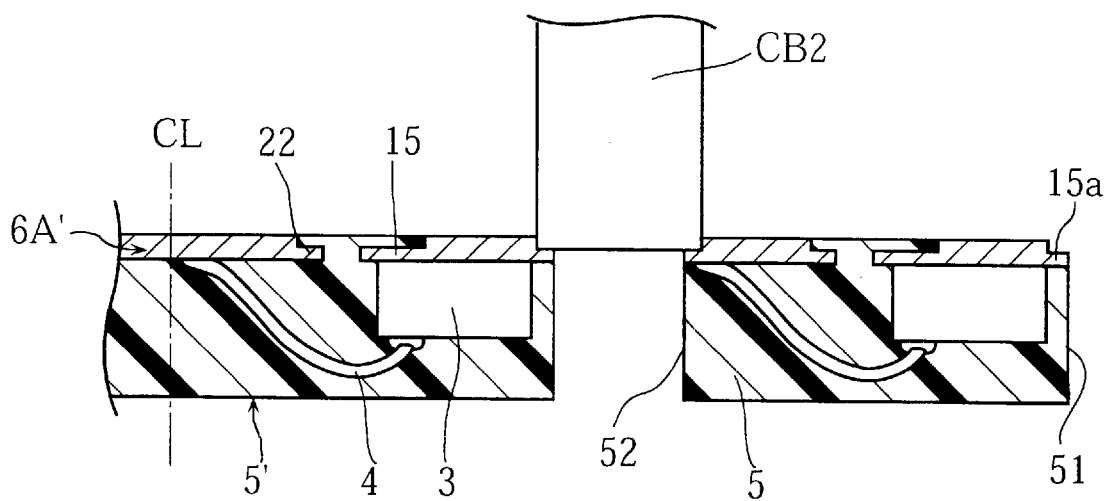

This problem is overcome by the second cutting operation by using the thicker cutter CB2, as shown in FIG. 17B. Specifically, the thicker cutter CB2 is used for making a cut at the same position as the first cutting operation is performed. At this time, however, the cut to be made is greater in width than the first cut, and the cutting depth is generally half the thickness of the leadframe 6A' ("partial cut" step). In this manner, the burrs 62 made by the first cutting are removed. In addition, since the second cutter CB2 only makes a shallow cut in the leadframe 6A', no secondary burrs are formed by the second cutting operation.

Figure 18A:
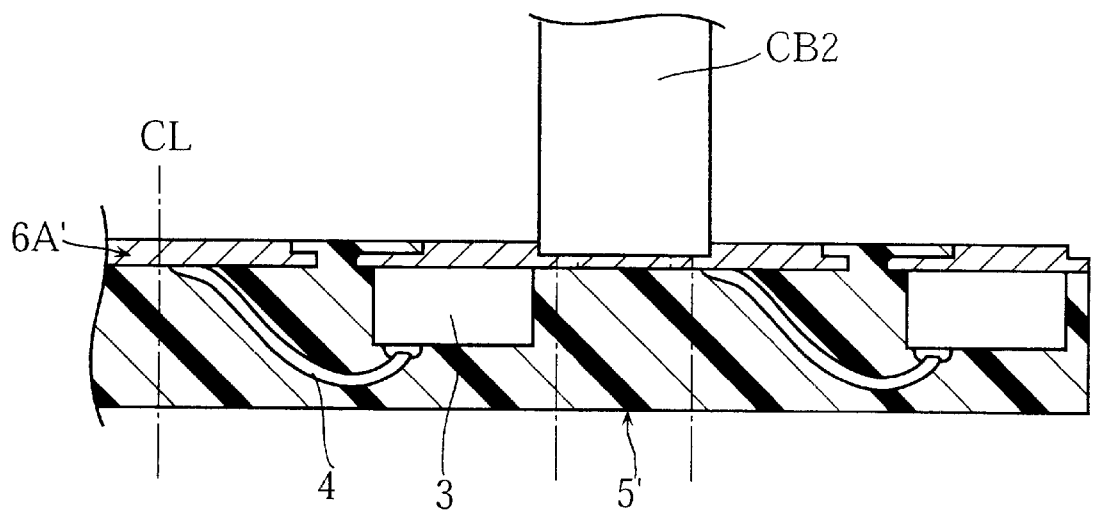
FIGS. 18A and 18B are sectional views showing another possible procedure for cutting the intermediate product shown in FIG. 16.
Figure 18B:
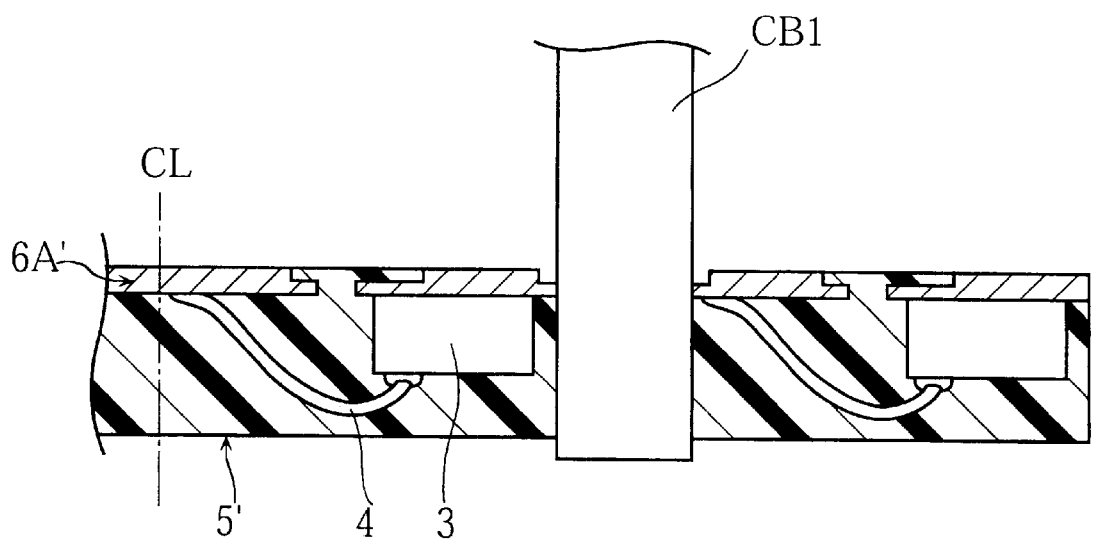
Figure 19A:
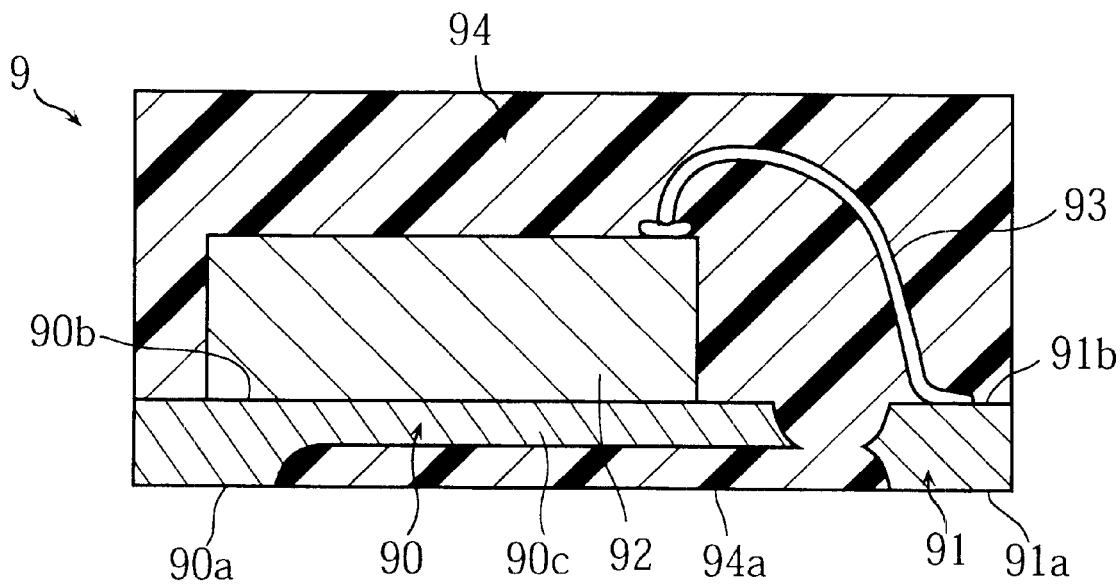
FIGS. 19A and 19B show a conventional semiconductor device.
Figure 19B:
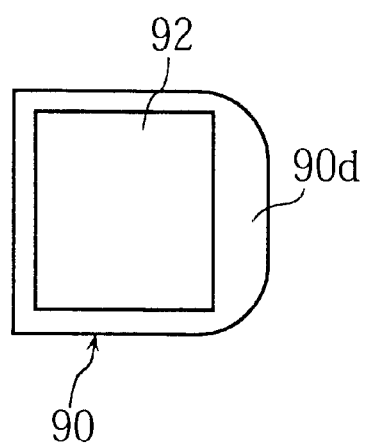

According to the present invention, the above cutting order may be reversed. Specifically, referring to FIG. 18A, the first cutting operation is performed by using the thicker cutter CB2 to make a half-depth cut in the leadframe 6A' ("partial cut"). Then, in the second cutting operation, the thinner cutter CB1 is used for making a full cut, as shown in FIG. 18B, at the same site as the first cutting operation is performed. In this manner again, no burrs are formed on the leadframe 6A', since only a shallow cut is made in the first operation and the thinned portion of the leadframe 6A' is cut in the second operation.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making a semiconductor device, the method comprising the steps of:

mounting a semiconductor chip on a leadframe;

producing an intermediate product by forming a packaging layer to enclose the chip, the intermediate product including the leadframe, the chip and the packaging layer; and cutting the intermediate product;

wherein the cutting step is performed by using a first cutter having a first thickness and a second cutter having a second thickness greater than the first thickness, the first cutter being used for making a full cut in the leadframe, the second cutter being used for making a partial cut in the leadframe, the full cut and the partial cut corresponding in position to each other.

2. The method according to claim 1, wherein the partial cut is made after the full cut is made.

3. The method according to claim 1, wherein the full cut is made after the partial cut is made.

4. The method according to claim 1, further comprising the step of preparing the leadframe by processing an electroconductive material having a uniform thickness.

5. The method according to claim 4, wherein the leadframe-preparing step includes first punching, stamping and second punching, and wherein the first punching is performed for forming a patterned region in the electroconductive material, the stamping being performed for compressing the patterned region to provide a stamped portion of a thickness smaller than the uniform thickness of the electroconductive material, the second punching being performed for removing an unnecessary part from the stamped portion.

6. The method according to claim 5, wherein the first punching produces a land and an opening adjacent to the land, the stamping causing the land to be spread out into the opening.

7. The method according to claim 5, wherein the packaging layer is formed to cover the stamped portion entirely and allow part of the leadframe to be exposed.

8. A method of making a leadframe for fabricating a semiconductor device, the method comprising the steps of:

performing first punching on an electroconductive plate having a uniform thickness for forming an opening having an initial contour;

stamping the electroconductive plate to form a stamped portion spreading inwardly into the opening beyond the initial contour thereof, the stamped portion having a thickness smaller than said uniform thickness; and performing second punching on the electroconductive plate to remove an unnecessary part from the stamped portion.

* * * * *